(12) United States Patent
Sumi

(10) Patent No.: US 12,236,739 B2
(45) Date of Patent: Feb. 25, 2025

(54) PUSHBUTTON SWITCH, OPERATING UNIT, AND AMUSEMENT MACHINE

(71) Applicant: OMRON Corporation, Kyoto (JP)

(72) Inventor: Masaaki Sumi, Kyoto (JP)

(73) Assignee: OMRON Corporation, Kyoto (JP)

( * ) Notice: Subject to any disclaimer, the term of this patent is extended or adjusted under 35 U.S.C. 154(b) by 364 days.

(21) Appl. No.: 17/996,813

(22) PCT Filed: May 28, 2020

(86) PCT No.: PCT/JP2020/021157
§ 371 (c)(1),
(2) Date: Oct. 21, 2022

(87) PCT Pub. No.: WO2021/240739
PCT Pub. Date: Dec. 2, 2021

(65) Prior Publication Data
US 2023/0196868 A1    Jun. 22, 2023

(51) Int. Cl.
*G07F 17/32* (2006.01)
*H01H 1/54* (2006.01)
*H01H 13/14* (2006.01)

(52) U.S. Cl.
CPC ........... *G07F 17/3209* (2013.01); *H01H 1/54* (2013.01); *H01H 13/14* (2013.01)

(58) Field of Classification Search
CPC ........... H01H 2003/12; H01H 2009/02; H01H 2009/0285; H01H 2009/0292; H01H 2013/00; H01H 2013/02; H01H 2013/04; H01H 2013/50; H01H 2013/52; H01H 2215/042; H01H 3/00; H01H 3/02; H01H 3/12; H01H 3/222; H01H 5/00; H01H 5/02; H01H 9/00; H01H 9/02; H01H 9/0242; H01H 50/18; H01H 1/54; H01H 13/00; H01H 13/02; H01H 13/04; H01H 13/10; H01H 13/14; H01H 13/50; H01H 13/52; H01H 13/83; A63F 9/24; A63F 9/2401; A63F 9/2402; A63F 9/2404;
(Continued)

(56) References Cited

U.S. PATENT DOCUMENTS 10,431,037 B2    10/2019    Jadeja
2002/0056321 A1*    5/2002    Fallak .................. G05G 1/10
73/488

(Continued)

FOREIGN PATENT DOCUMENTS

WO    2015/174092 A1    11/2015
WO    2017/094234 A1    6/2017

OTHER PUBLICATIONS

English translation of the International Search Report ("ISR") of PCT/JP2020/021157 mailed on Aug. 18, 2020.
(Continued)

*Primary Examiner* — Anthony R Jimenez
(74) *Attorney, Agent, or Firm* — METROLEX IP LAW GROUP, PLLC; Robert L. Scott, Esq.

(57) ABSTRACT

A pushbutton switch according to one or more embodiment may include a first attachment, an operable portion, and a detector. The first attachment has a loose-fitting hole to loosely receive a locking magnet. The detector includes a switcher that selectively places an attraction magnet or a repulsion magnet at a position facing the locking magnet.

5 Claims, 9 Drawing Sheets

(58) Field of Classification Search
CPC ........ A63F 9/2405; A63F 9/245; B60R 16/00; B60R 16/02; G06F 3/041; G06F 3/044; G06F 17/00; G06F 17/32; G06F 17/3209; G05G 23/00
USPC ........................................................ 200/341
See application file for complete search history.

(56) References Cited

U.S. PATENT DOCUMENTS

| | | | |
|---|---|---|---|
| 2015/0212603 A1* | 7/2015 | Raisch | G06F 3/041 345/174 |
| 2017/0052617 A1 | 2/2017 | Okuzumi et al. | |
| 2018/0373351 A1 | 12/2018 | Sawada et al. | |
| 2019/0250740 A1 | 8/2019 | Okuzumi et al. | |

OTHER PUBLICATIONS

Written Opinion("WO") of PCT/JP2020/021157 mailed on Aug. 18, 2020.

* cited by examiner

PUSHBUTTON SWITCH, OPERATING UNIT, AND AMUSEMENT MACHINE

FIELD

The present disclosure relates to a pushbutton switch, an operating unit, and an amusement machine.

BACKGROUND

Patent Literature 1 describes a known pushbutton assembly. The pushbutton assembly described in Patent Literature 1 includes a display and at least one pushbutton switch. The display includes a transparent material on its display surface to support the pushbutton switch. The transparent material is a support for the pushbutton switch.

CITATION LIST

Patent Literature

Patent Literature 1: U.S. Pat. No. 10,431,037

SUMMARY

Technical Problem

In the pushbutton assembly described in Patent Literature 1, the pushbutton switch is received in an attachment opening in the transparent material. However, the structure with an opening may lower the strength of the transparent material. The pushbutton switch may be included in a machine such as an amusement machine and operated by a user with strong force. In this case, in particular, the transparent material may fracture with cracks extending from the opening.

A pushbutton switch according to one or more embodiments includes an operable portion attached to one surface of a transparent material and a detector attached to the other surface of the transparent material. The operable portion includes a press portion to be operated by a user. The detector detects the pressed state of the press portion. The pushbutton switch may be installable on the transparent material without an attachment opening. The pushbutton switch includes consumable components, specifically the press portion or other moving components, or components that support these components. Such components are to be replaceable.

The pushbutton switch thus may be to allow easy attachment and removal of the operable portion. The operable portion may also be to be prevented from being removed by the user with, for example, ill intentions.

One or more embodiments is directed to a technique for preventing an operable portion from being removed from a pushbutton switch by a person other than the manager.

A switch, a unit, and a machine according to one or more embodiments have the structures described below.

More specifically, a pushbutton switch according to one or more embodiments includes an attachment fixed to a first surface of a support may comprise a plate, an operable portion removably engaged with the attachment, and a detector attached to a second surface of the support and facing the operable portion. The operable portion includes a press portion and a movable magnet movable in a pressing direction from the operable portion toward the detector and in a direction opposite to the pressing direction. The operable portion is rotatable about an axis aligned with the pressing direction to be engaged with the attachment. The attachment has a loose-fitting hole to loosely receive the movable magnet with the operable portion being engaged with the attachment. The detector includes a switcher that selectively places a first magnet to attract the movable magnet or a second magnet to repel the movable magnet at a position facing the movable magnet with the operable portion being engaged with the attachment.

An operating unit according to one or more embodiments includes a transparent support and a display together serving as a touchscreen, and a pushbutton switch. The pushbutton switch includes an attachment fixed to a surface of the transparent support opposite to the display, an operable portion removably engaged with the attachment, and a detector attached to a surface of the transparent support adjacent to the display. The detector faces the operable portion. The operable portion includes a press portion and a movable magnet movable in a pressing direction from the operable portion toward the detector and in a direction opposite to the pressing direction. The operable portion is rotatable about an axis aligned with the pressing direction to be engaged with the attachment. The attachment has a loose-fitting hole to loosely receive the movable magnet with the operable portion being engaged with the attachment. The detector includes a switcher that selectively places a first magnet to attract the movable magnet or a second magnet to repel the movable magnet at a position facing the movable magnet with the operable portion being engaged with the attachment.

An amusement machine according to one or more embodiments includes a first display that displays an image for amusement, a transparent support and a second display together serving as a touchscreen, and a pushbutton switch. The pushbutton switch includes an attachment fixed to a surface of the transparent support opposite to the second display, an operable portion removably engaged with the attachment, and a detector attached to a surface of the transparent support adjacent to the second display. The detector faces the operable portion. The operable portion includes a press portion and a movable magnet movable in a pressing direction from the operable portion toward the detector and in a direction opposite to the pressing direction. The operable portion is rotatable about an axis aligned with the pressing direction to be engaged with the attachment. The attachment has a loose-fitting hole to loosely receive the movable magnet with the operable portion being engaged with the attachment. The detector includes a switcher that selectively places a first magnet to attract the movable magnet or a second magnet to repel the movable magnet at a position facing the movable magnet with the operable portion being engaged with the attachment.

The technique according to one or more embodiments may prevent the operable portion from being removed from the pushbutton switch by a person other than the manager.

DETAILED DESCRIPTION

One or more embodiments (hereafter also referred to as the present embodiment) will now be described with reference to the drawings. In the present embodiment or embodiments, a pushbutton switch and an operating unit are included in an amusement machine. The invention is not limited to the embodiments described below, and may be variously designed without departing from the spirit and scope of the invention. The pushbutton switch and the operating unit according to one or more embodiments can also be used for industrial equipment and consumer equipment, as well as for various amusement machines.

1. Example Use

Figure 1:
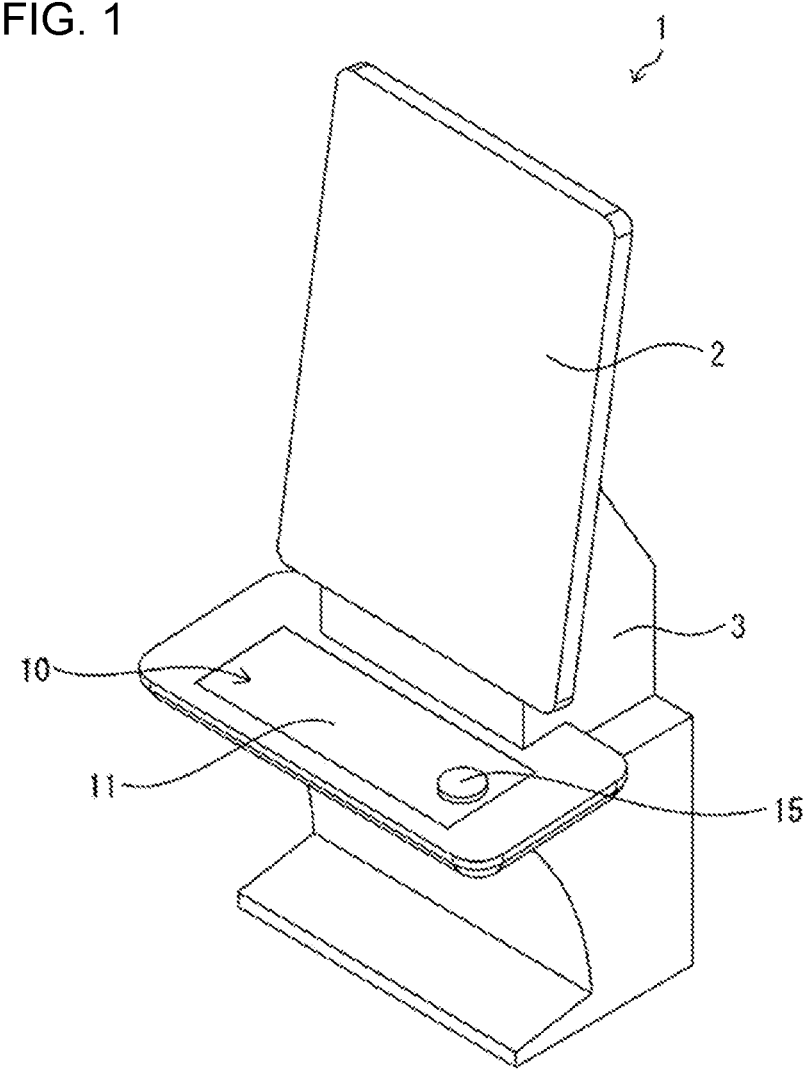
FIG. 1 is a diagram illustrating an external perspective view of an amusement machine according to one or more embodiments.
Figure 3:
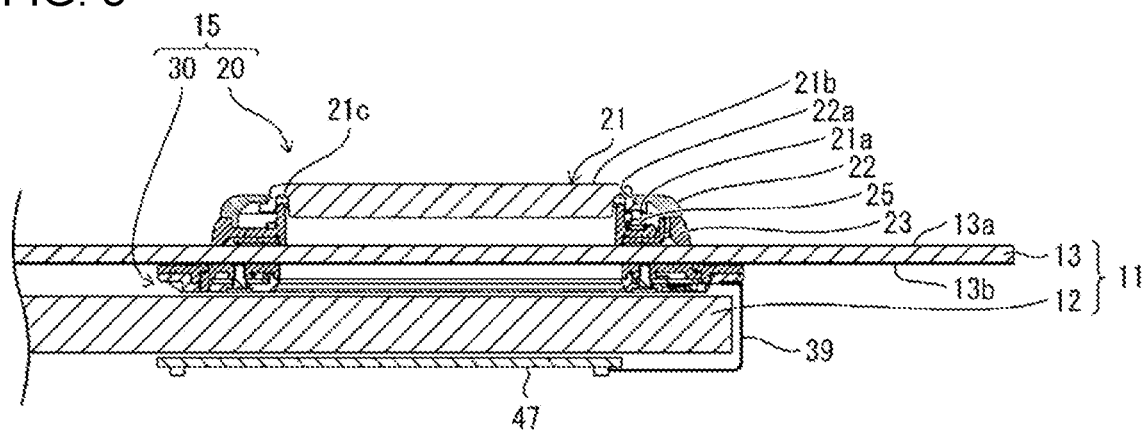
FIG. 3 is a diagram illustrating a cross-sectional view taken along line A-A as viewed in a direction indicated by arrows in FIG. 2.
Figure 4:
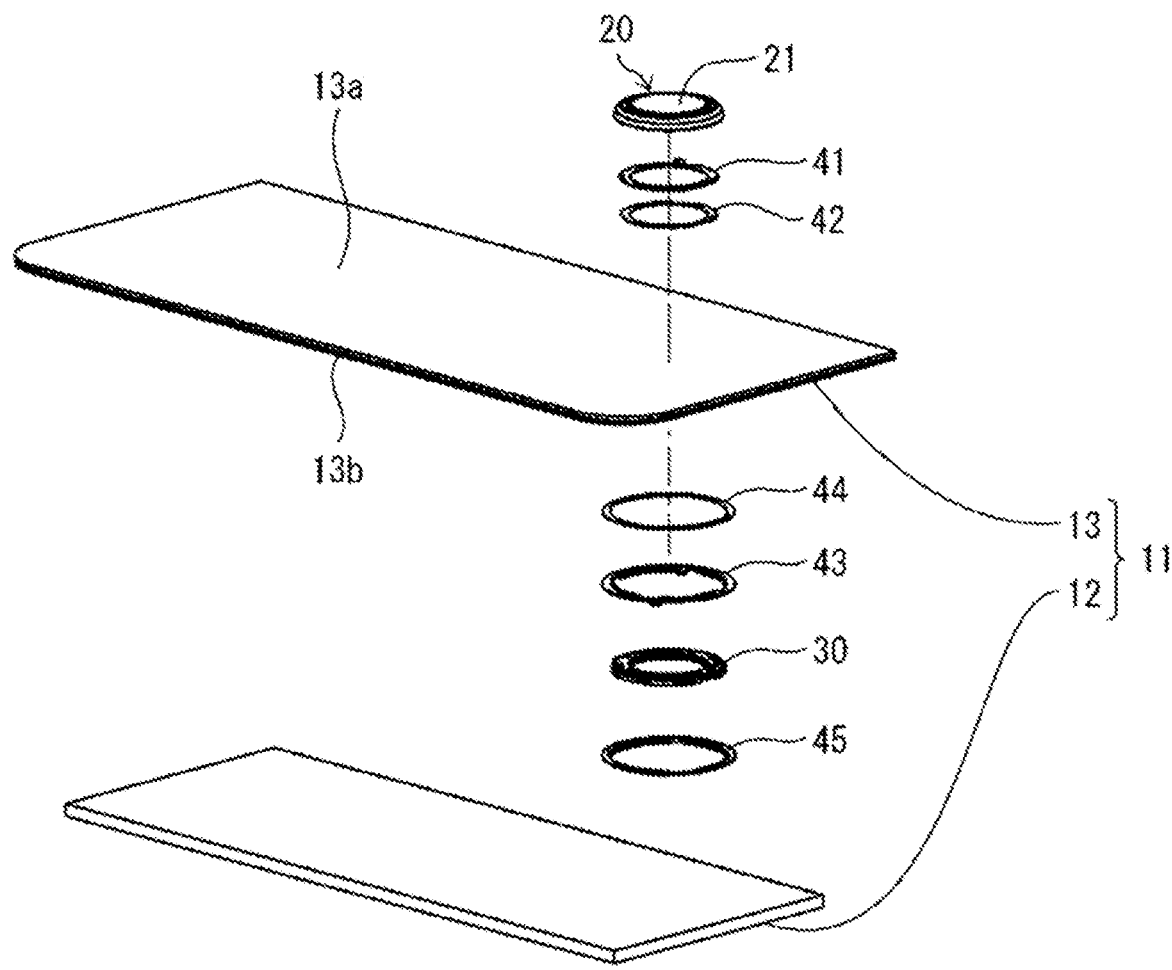
FIG. 4 is a diagram illustrating an exploded perspective view of a button deck, such as is shown in FIG. 2.

As shown in FIG. 1, a pushbutton switch 15 and a button deck 10, which is an operating unit including the pushbutton switch 15, may be included in an amusement machine 1. As shown in FIGS. 3 and 4, the button deck 10 includes the pushbutton switch 15 and a display input unit 11. The display input unit 11 includes a transparent support plate 13 and a display 12 and serves as a touchscreen. The pushbutton switch 15 includes, as separate portions, an operable portion 20 and a detector 30. The operable portion 20 includes a button (a press portion) 21. The detector 30 detects the pressed state of the button 21. The operable portion 20 is attached to one surface of the transparent support plate 13. The detector 30 is attached to the other surface of the transparent support plate 13. The operable portion 20 and the detector 30 face each other with the transparent support plate 13 in between.

Figure 15:
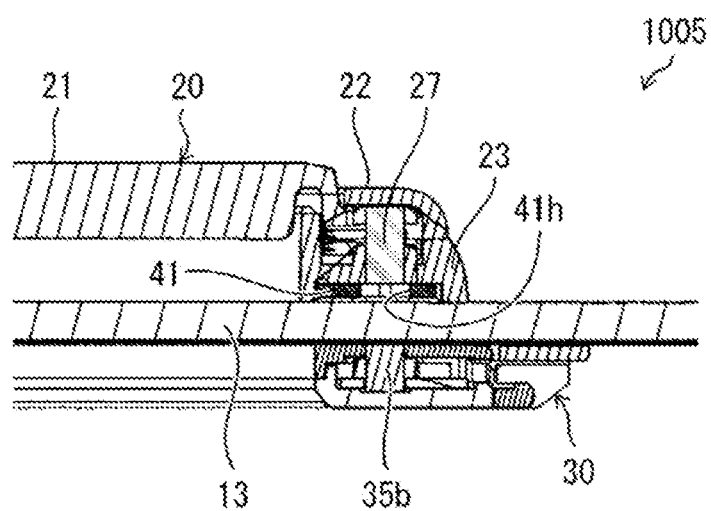
FIG. 15 is a diagram illustrating views of a lock assembly for an operable portion, such as is shown in FIG. 7.
Figure 15:
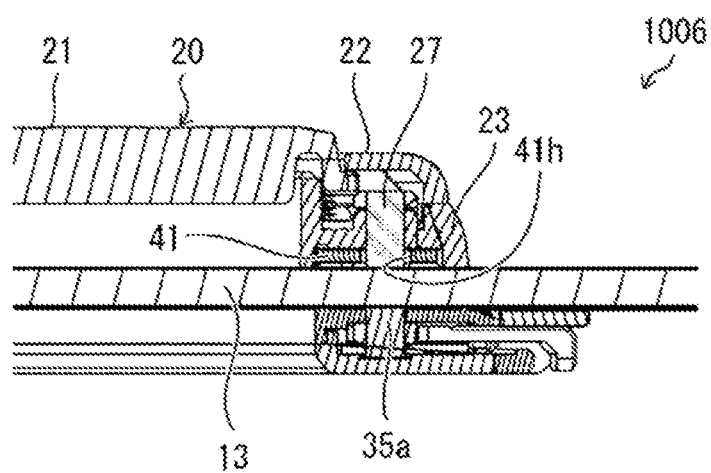

As shown in FIG. 4, a first attachment 41 is fixed to one surface of the transparent support plate 13. As shown in FIG. 15, the first attachment 41 has a loose-fitting hole 41h for loosely receiving a locking magnet 27 with the operable portion 20 being engaged with the first attachment 41.

The detector 30 includes a switcher for selectively placing an attraction magnet 35a or a repulsion magnet 35b at the position facing the locking magnet 27 with the operable portion 20 being engaged with the first attachment 41. This structure can lock the operable portion 20 to the first attachment 41 and prevent the operable portion 20 from being removed from the pushbutton switch 15 by a person other than the manager.

2. Example Structure

1. Amusement Machine

The schematic structure of the amusement machine according to the present embodiment will now be described with reference to FIG. 1. FIG. 1 is an external perspective view of the amusement machine 1 according to the present embodiment.

As shown in FIG. 1, the amusement machine 1 includes a main display unit (a first display) 2, a button deck (an operating unit) 10, and a housing 3 supporting these components.

The main display unit 2 displays images for a game played on the amusement machine 1 and includes, for example, a liquid crystal display (LCD). The main display unit 2 has its display surface facing the front of the amusement machine 1.

The button deck 10 receives the player's operations in a game on the amusement machine 1. In the present example, the button deck 10 is located below the main display unit 2 at the front of the amusement machine 1. The button deck 10 is rectangular and elongated laterally. The button deck 10 includes the display input unit 11 as a touchscreen, and the pushbutton switch 15.

For the amusement machine 1 providing slot machine gaming involving spinning reels, for example, the main display unit 2 displays multiple reels with multiple types of symbols. The button deck 10 receives the player's instruction for spinning the multiple reels, and receives the number of paylines and the number of bets selected by the player.

The multiple reels start spinning in response to the player's instruction for spinning received by the button deck 10. The reels automatically stop spinning under the control of a main controller 60 (refer to FIG. 11, described later). The pattern is determined by the combination of symbols on paylines and by the symbols appearing when the multiple reels are stopped. The player is rewarded based on the determined pattern and the number of bets.

2. Button Deck

Figure 2:
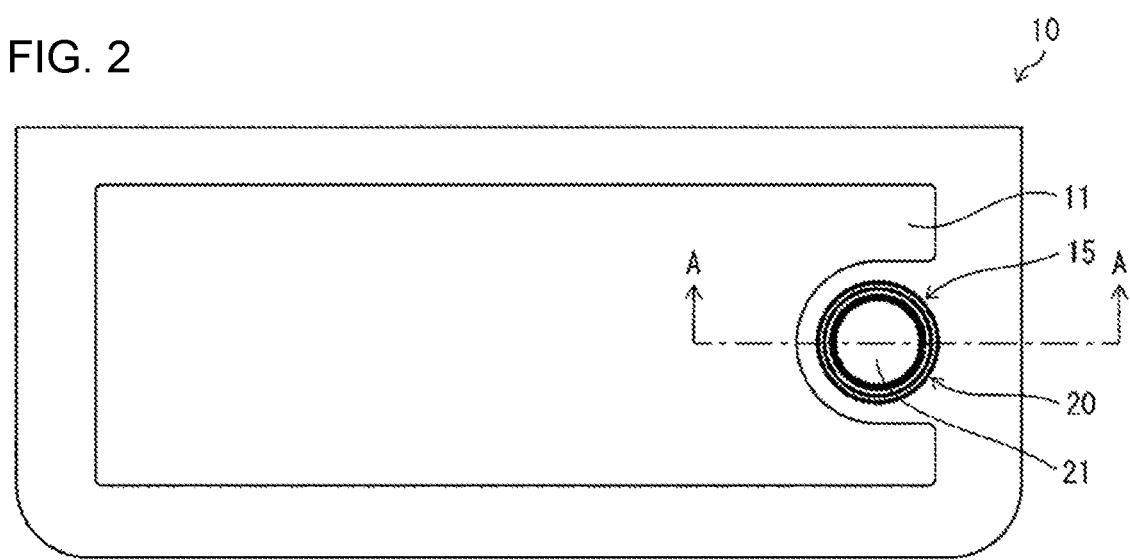
FIG. 2 is a diagram illustrating a plan view of a button deck that is an operating unit of an amusement machine, such as is shown in FIG. 1.
Figure 5:
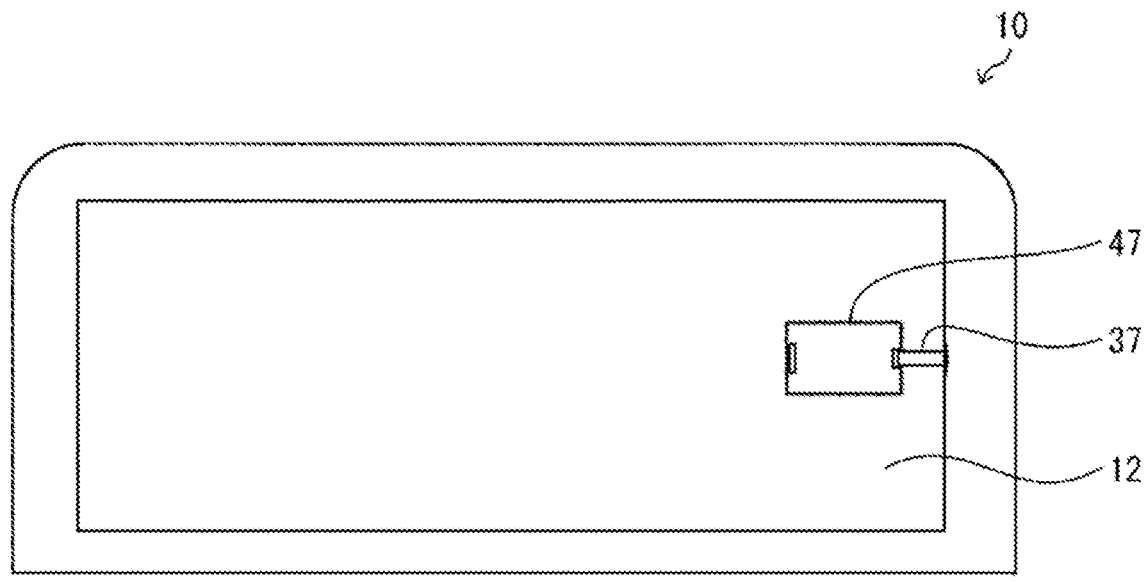
FIG. 5 is a diagram illustrating a bottom view of a button deck, such as is shown in FIG. 2.

FIG. 2 is a plan view of the button deck 10. FIG. 3 is a cross-sectional view taken along line A-A as viewed in the direction indicated by arrows in FIG. 2. FIG. 4 is an exploded perspective view of the button deck 10. FIG. 5 is a bottom view of the button deck 10.

As shown in FIG. 2, the display input unit 11 is rectangular and elongated laterally. The display input unit 11 includes the pushbutton switch 15 on its display surface. In the present example, the pushbutton switch 15 is circular and at the right end as viewed in plan (refer to FIG. 1).

As shown in FIG. 3, the display input unit 11 includes a display (a second display) 12 and a transparent support plate (a support) 13 located on the display surface of the display 12. In the present example, the transparent support plate 13 is a position input device. The transparent support plate 13 and the display 12 together serve as a touchscreen. The display 12 displays images of keys for receiving inputs to the amusement machine 1, images for a game, or other images.

The pushbutton switch 15 includes the operable portion 20 and the detector 30. The operable portion 20 is attached to one surface, specifically a first surface 13a, of the transparent support plate 13. The first surface 13a is opposite to the surface facing the display 12. The operable portion 20 includes the button (a press portion) 21 to receive a pressing operation. The button 21 is transparent.

The detector 30 is attached to the other surface, specifically a second surface 13b, of the transparent support plate 13 and faces the operable portion 20. The second surface 13b is adjacent to the display 12. The detector 30 includes sensors for detecting the pressed state of the button 21 through the transparent support plate 13.

Figure 9:
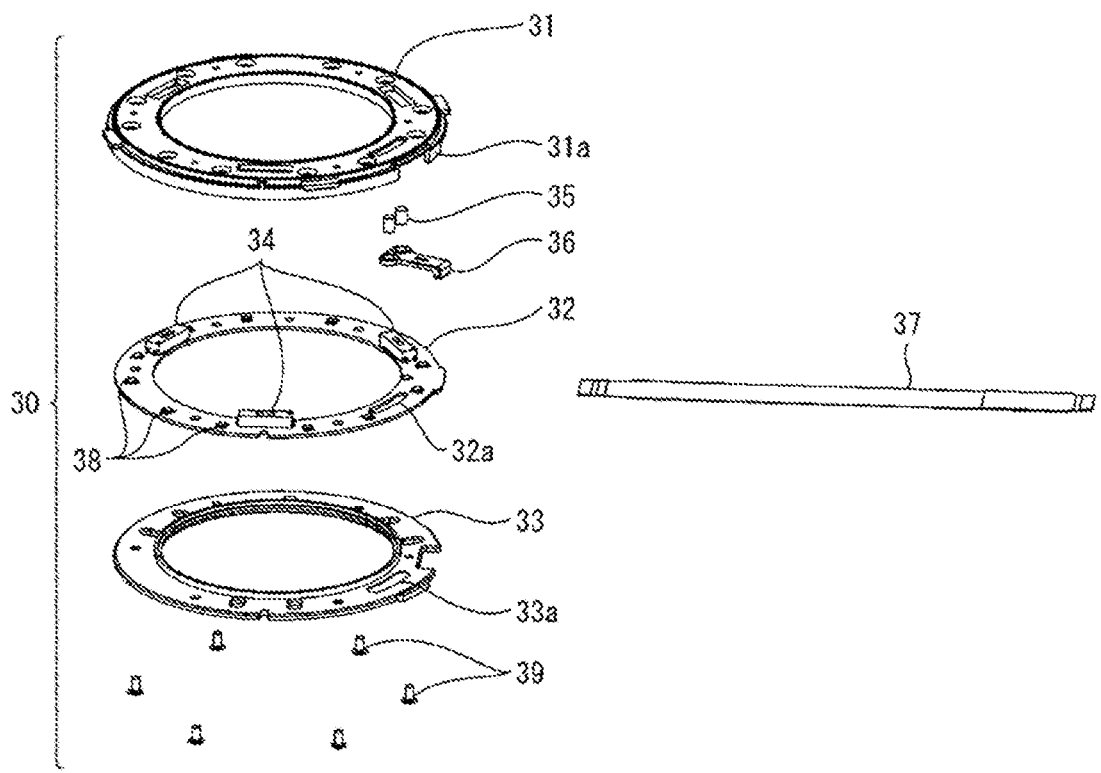
FIG. 9 is a diagram illustrating an exploded perspective view of a detector in a pushbutton switch in a button deck, such as is shown in FIG. 2.

In the present example, the sensors are reflective sensors 34 (refer to FIG. 9). However, the sensors may be any sensors other than the reflective sensors 34, such as range sensors, that can detect the pressed state of the button 21 through the transparent support plate 13. Electronic components for detecting a pressing operation may be located in the operable portion 20. Such a structure allows a wider choice of sensors.

In the present example, the detector 30 is formed from a transparent material in its area facing the button 21 to allow the display surface of the display 12 to be viewed through the transparent button 21. The detector 30 may have an opening in its area facing the button 21.

In the present example, the pushbutton switch 15 is located above the display 12. The support is the transparent support plate 13 that is entirely transparent except for its outer edge portion. However, the pushbutton switch 15 may not be located above the display 12. In this case, the support may be transparent simply in its area receiving the operable portion 20 and the detector 30, or more specifically in its area through which the sensors in the detector 30 detect the pressed state of the button 21.

In the present example, as shown in FIG. 4, the pushbutton switch 15 includes the first attachment 41, a second attachment 43, and a locking member 45. The operable portion 20 is attached to the first surface 13a of the transparent support plate 13 with the first attachment 41 in between. The operable portion 20 is removably engaged with the first attachment 41. The first attachment 41 has an annular shape corresponding to the shape of a bezel 22 (refer to FIG. 7, described later) in the operable portion 20. The first attachment 41 is fixed to the first surface 13a using a double-sided tape piece 42 in the present example. Attaching the operable portion 20 to the first attachment 41 is described later.

The detector 30 is attached to the second surface 13b of the transparent support plate 13 with the second attachment 43 in between. The detector 30 is removably engaged with the second attachment 43. In the present example, the second attachment 43 together with the locking member 45 allows attachment of the detector 30 to the transparent support plate 13. Each of the second attachment 43 and the locking member 45 has an annular shape and is fitted on the outer periphery of the detector 30. The second attachment 43 receives the detector 30 on its inner periphery, and the locking member 45 is fitted on the outer periphery of the detector 30. The locking member 45 is rotated relative to the second attachment 43 and engaged with the second attachment 43. This attaches the detector 30 to the second surface 13b. The second attachment 43 is fixed to the second surface 13b using a double-sided tape piece 44 in the present example.

Further, as shown in FIGS. 3 and 5, the display 12 in the display input unit 11 has its back surface connected to a relay board (a controller) 47 (described later). The relay board 47 is connected to the detector 30 through a flexible printed circuit (FPC) 37.

Figure 6:
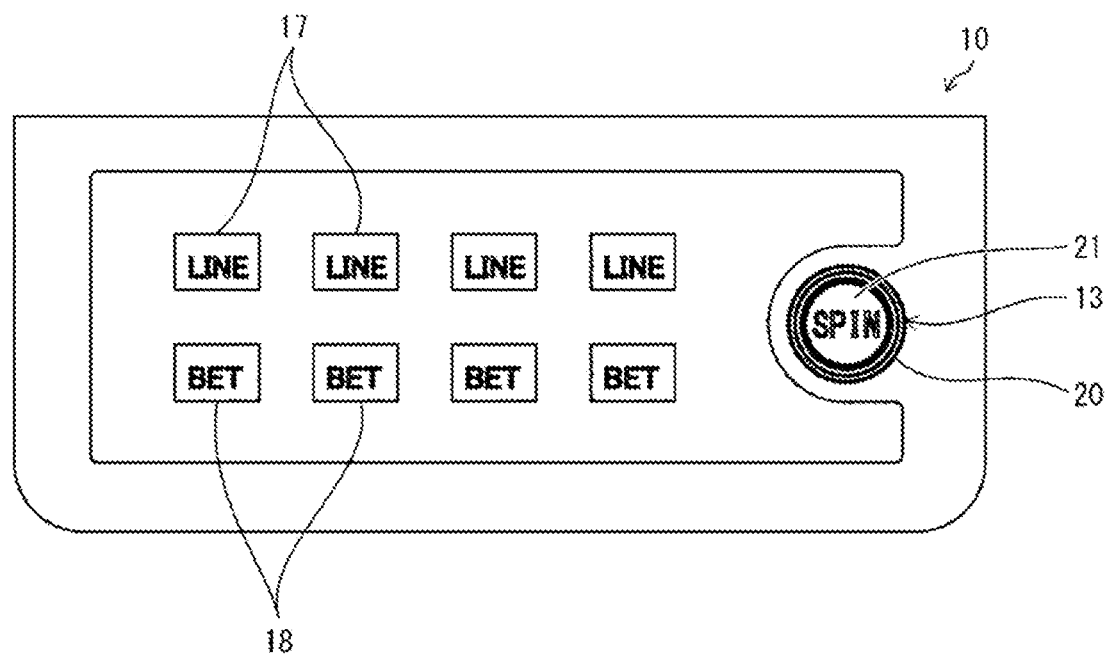
FIG. 6 is a diagram illustrating a view of example display on a button deck, such as is shown in FIG. 2.

FIG. 6 is a view showing example display on the button deck 10. The example display in FIG. 6 shows an operation screen for a slot machine game played on the amusement machine 1. The pushbutton switch 15 serves as a SPIN button that receives the instruction for spinning the multiple reels. The display 12 displays the letters SPIN indicating the SPIN button at the position corresponding to the button 21. The letters SPIN are viewable through the transparent button 21. The display input unit 11 displays LINE buttons 17 for selecting the number of paylines and BET buttons 18 for selecting the number of bets.

3. Pushbutton Switch Structure 3-1. Operable Portion

Figure 7:
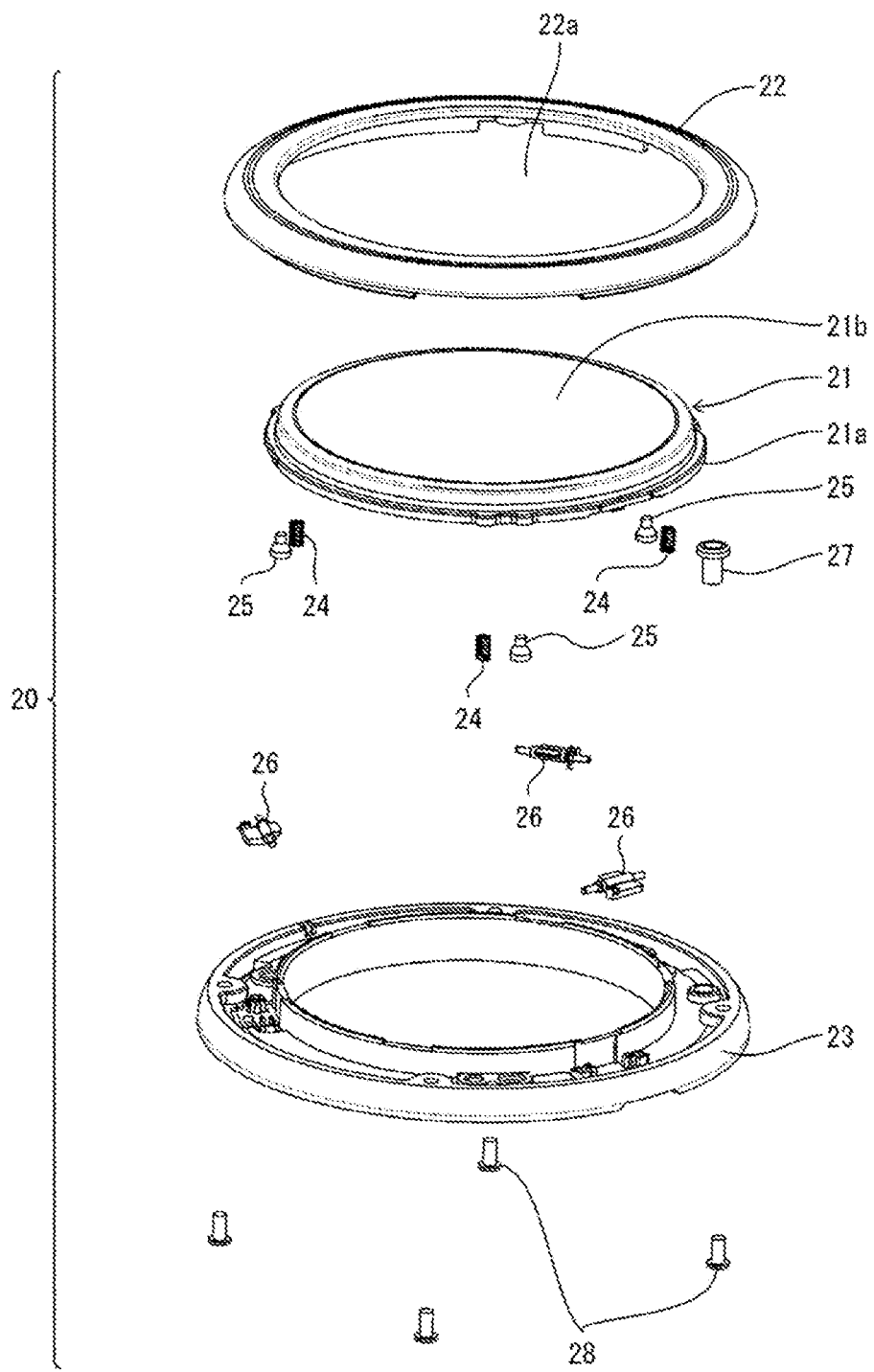
FIG. 7 is a diagram illustrating an exploded perspective view of an operable portion of a pushbutton switch in a button deck, such as is shown in FIG. 2.
Figure 8:
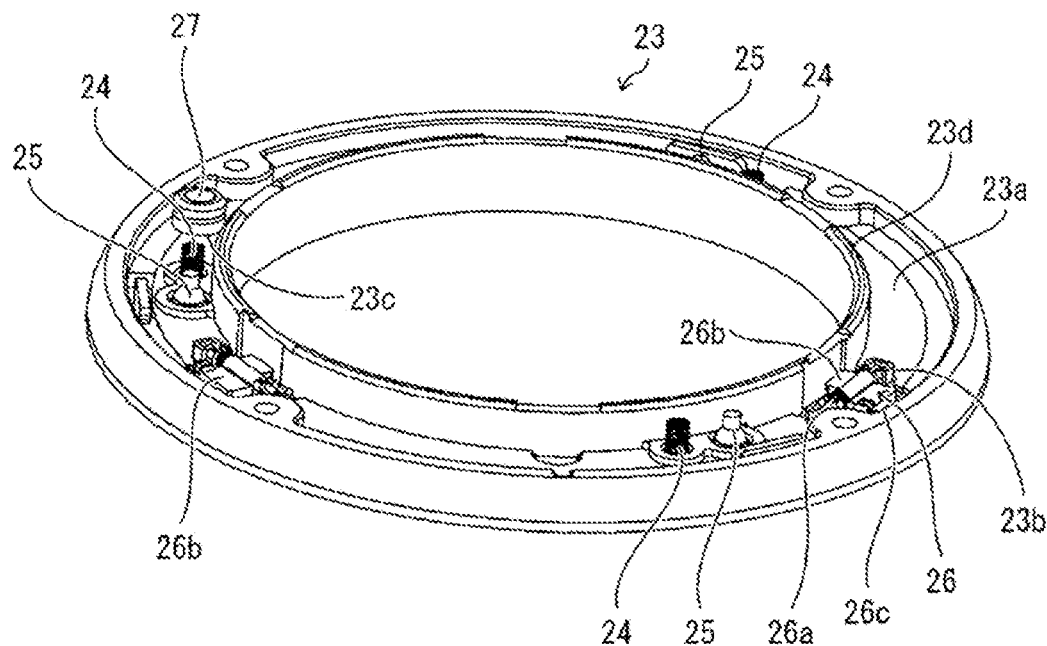
FIG. 8 is a diagram illustrating a perspective view of a base supporting multiple components in an operable portion, such as is shown in FIG. 7.

The operable portion 20 will now be described with reference to FIGS. 3, 7, and 8. FIG. 7 is an exploded perspective view of the operable portion 20 of the pushbutton switch 15 in the button deck 10. FIG. 8 is a perspective view of a base 23 supporting multiple components in the operable portion 20.

As shown in FIG. 7, the operable portion 20 includes the button 21, the bezel 22, the base 23, multiple springs 24, multiple tactile-sensation rubber pieces 25, the locking magnet 27, and multiple reflective flappers 26.

The button 21 is supported between the bezel 22 and the base 23 and can receive a pressing operation. For ease of explanation, the operable portion 20 is located horizontally, and the button 21 has the pressing direction being downward and the returning direction being upward.

The button 21 is formed from a transparent material and is circular in the present example (refer to FIG. 2). The button 21 includes a flange 21a on its outer periphery. The button 21 can be pressed with the flange 21a being held between the base 23 and the bezel 22 attached to the base 23. The bezel 22 has an opening 22a through which an upper surface 21b of the button 21 is exposed.

The base 23 supports, for example, the button 21, the bezel 22, the multiple springs 24, the multiple tactile-sensation rubber pieces 25, the locking magnet 27, and multiple reflective flappers 26. The base 23 is fastened to the transparent support plate 13 with the first attachment 41 in between.

As shown in FIG. 8, the base 23 includes an annular component compartment 23a in an outer peripheral portion. The component compartment 23a accommodates the multiple springs 24, the multiple tactile-sensation rubber pieces 25, the locking magnet 27, and the multiple reflective flappers 26.

The multiple springs 24 return the pressed button 21 to the position before pressing. The multiple tactile-sensation rubber pieces 25 provide a tactile sensation to the player pressing the button 21. In the present example, three springs 24 and three tactile-sensation rubber pieces 25 are included.

The multiple springs 24 and the multiple tactile-sensation rubber pieces 25 are in contact with the flange 21a on the outer periphery of the button 21 (refer to FIG. 3). The multiple springs 24 in contact with the flange 21a can return the pressed button 21 to its original position. The multiple tactile-sensation rubber pieces 25 in contact with the flange 21a can provide a tactile sensation to the player pressing the button 21.

The reflective flappers 26 are used when the detector 30 detects the pressed state of the button 21. In the present example, three (multiple) reflective flappers 26 are included. The reflective flappers 26 are supported pivotally on support portions 23b of the component compartment 23a. Each reflective flapper 26 includes a shaft 26a extending in the circumferential direction of the component compartment 23a.

Each reflective flapper 26 includes a press piece 26b located inward from the shaft 26a and a reflective portion 26c located outward from the shaft 26a. The press piece 26b comes in contact with and is pressed by a lower end 21d (refer to views 1000 and 1001 in FIG. 12) of an outer peripheral portion of the button 21. The reflective portion 26c has its lower surface being a reflective surface. The reflective flapper 26 changes its orientation in accordance with the pressed or unpressed state of the button 21 and thus changes the orientation of the reflective surface (refer to the views 1000 and 1001 in FIG. 12). The component compartment 23a has openings at the bottom to allow passage of light from the reflective sensors 34 in the detector 30 and allow passage of light reflected by the reflective flappers 26 toward the reflective sensors 34. The first attachment 41 also has such openings.

The locking magnet 27 is rod-like and has the direction of magnetization parallel to the pressing direction of the button 21. The locking magnet 27 is a movable magnet movable in the pressing direction of the button 21 and in the direction opposite to the pressing direction. The locking magnet 27 is loosely fitted in the loose-fitting hole 41h (refer to FIG. 15) in the first attachment 41 to lock the operable portion 20 and prevent removal from the first attachment 41. The locking magnet 27 is fitted loosely in a hole 23c in the bottom of the component compartment 23a. The locking magnet 27 includes a head with a larger diameter than the other portion. The locking magnet 27 is prevented from falling out of the hole 23c with its head stuck in the hole 23c.

The component compartment 23a includes an inner peripheral wall 23d defining the component compartment 23a. The wall 23d guides the button 21 to move vertically when the button 21 is pressed or returns. As shown in FIG. 3, the button 21 has a groove 21c on its lower surface to receive the upper end of the wall 23d.

To prepare the operable portion 20, the button 21 and the bezel 22 are fitted from above in this order onto the component compartment 23a accommodating the above various components. The base 23 and the bezel 22 are then fastened together with multiple screws 28.

3-2. Detector

Figure 10:
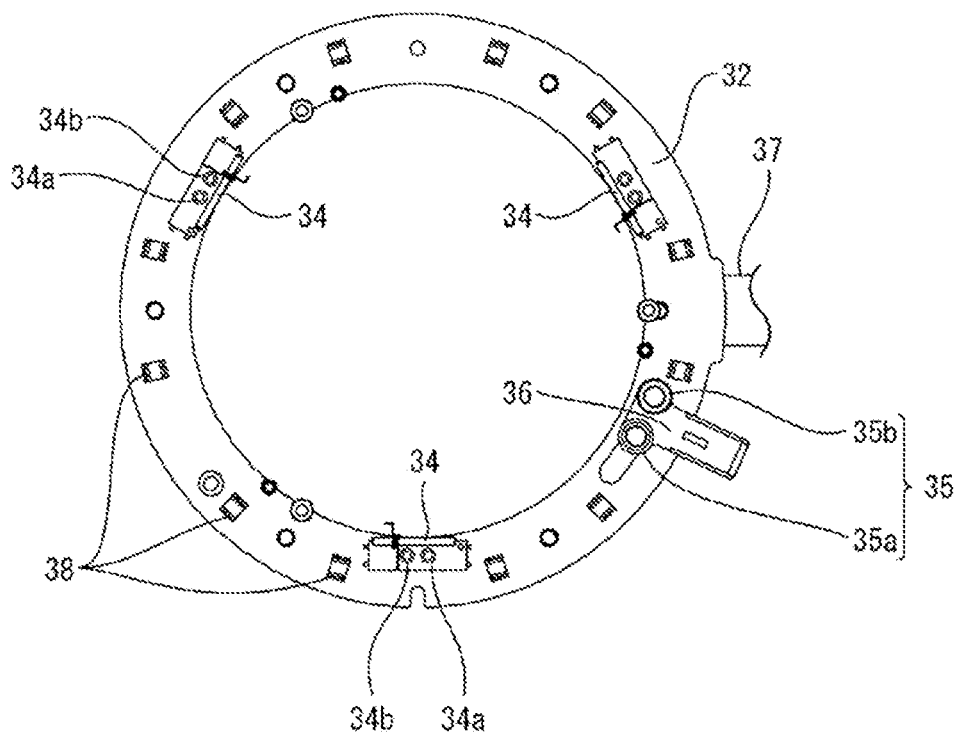
FIG. 10 is a diagram illustrating a plan view of a mounting board in a detector, such as is shown in FIG. 9.

The detector 30 will now be described with reference to FIGS. 3, 9, and 10. FIG. 9 is an exploded perspective view of the detector 30 in the pushbutton switch 15 in the button deck 10. FIG. 10 is a plan view of a mounting board 32. FIG. 10 also shows an operation lever 36 including an attachment magnet assembly 35.

As shown in FIG. 9, the detector 30 includes a case 31, the mounting board 32, a lower cover 33, the multiple reflective sensors 34, the attachment magnet assembly 35, the operation lever 36, and the FPC 37.

The multiple reflective sensors 34 are mounted on the mounting board 32. In the present example, three reflective sensors 34 are included to correspond to the three reflective flappers 26 in the operable portion 20. Each reflective sensor 34 faces the corresponding reflective flapper 26 with the operable portion 20 and the detector 30 being attached to the transparent support plate 13.

The reflective sensor 34 is an optical sensor including a light emitter 34a and a light receiver 34b. The light emitter 34a emits light toward the reflective flapper 26 through the transparent support plate 13. The reflective flapper 26 reflects the light that is then received by the light receiver 34b. The light receiver 34b receives light with intensity changeable in accordance with the orientation of the reflective flapper 26. The change in light intensity thus allows detection of the pressed state of the button 21.

As shown in FIG. 10, the mounting board 32 incorporates multiple light-emitting diodes (LEDs) (light emitters or electronic components) 38 as well as the multiple reflective sensors 34. The detector 30 can thus emit light when the multiple LEDs 38 is on.

The FPC 37 has one end connected to the mounting board 32 and the other end connected to the relay board 47 (refer to FIG. 3) attached to the back surface of the display 12. The FPC 37 electrically connects the mounting board 32 and the relay board 47.

As shown in FIGS. 9 and 10, the attachment magnet assembly 35 includes the attraction magnet 35a (a first magnet) and the repulsion magnet 35b (a second magnet). The attraction magnet 35a and the repulsion magnet 35b both are rod-like and have the direction of magnetization parallel to the pressing direction of the button 21, but are arranged to have opposite polarities. The attraction magnet 35a attracts the locking magnet 27 in the operable portion 20 through the transparent support plate 13. The repulsion magnet 35b repels and lifts the locking magnet 27 in the operable portion 20 through the transparent support plate 13.

The attraction magnet 35a and the repulsion magnet 35b are supported integrally on the operation lever 36. The operation lever 36 protrudes outward from the outer periphery of the detector 30. The operation lever 36 is movable back and forth circumferentially along a guide slot 32a in the mounting board 32 and along a guide slot 33a in the lower cover 33.

The operation lever 36 is operable to switch the magnet facing the locking magnet 27 in the operable portion 20 between the attraction magnet 35a and the repulsion magnet 35b. The attachment magnet assembly 35 and the operation lever 36 serve as a switcher. The switcher selectively places the first magnet or the second magnet at the position facing the locking magnet 27 with the base 23 being engaged with the first attachment 41.

The case 31 supports, for example, the mounting board 32, the multiple reflective sensors 34, the attachment magnet assembly 35, and the operation lever 36. The case 31 has openings through which the attachment magnet assembly 35 and the multiple reflective sensors 34 face the locking magnet 27 and the multiple reflective flappers 26 in the operable portion 20. The lower cover 33 is fitted to the case 31 and covers the bottom of the detector 30.

To prepare the detector 30, the lower cover 33 is fitted onto the bottom of the case 31 accommodating, for example, the attachment magnet assembly 35, the operation lever 36, and the mounting board 32. The case 31 and the lower cover 33 are then fastened together with multiple screws 39.

4. Control System in Amusement Machine

Figure 11:
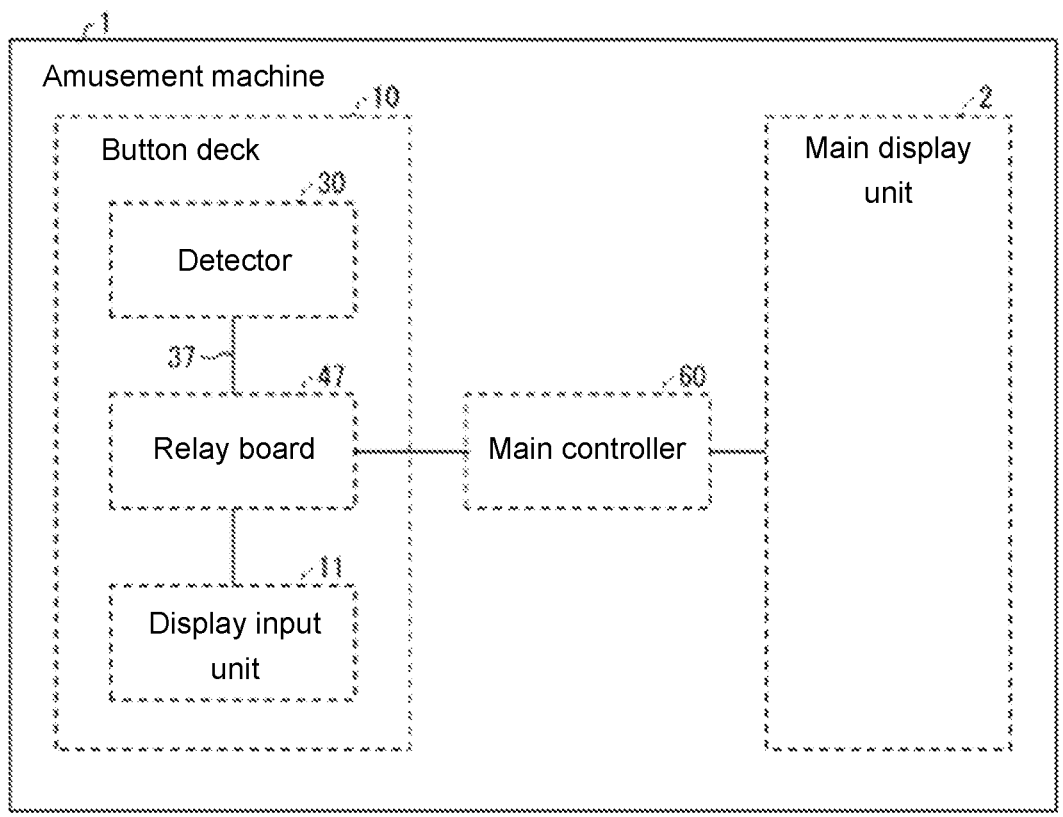
FIG. 11 is a block diagram illustrating an amusement machine, such as is shown in FIG. 1, that includes a control system.

FIG. 11 is a block diagram of the amusement machine 1, showing a control system. As shown in FIG. 11, the amusement machine 1 includes the main controller 60 and the relay board 47 as a controller. The main controller 60 is connected to the main display unit 2 and causes the main display unit 2 to display images for a game to perform the game.

The main controller 60 is also connected to the relay board 47 and receives, using the relay board 47, an instruction input on the button deck 10. The main controller 60 also controls the button deck 10 using the relay board 47. The relay board 47 controls the operation of the button deck 10, and is connected to the detector 30 through the FPC 37 and also connected to the display input unit 11 as a touch screen.

As described above, the button deck 10 in the present example includes the pushbutton switch 15 including, as separate portions, the operable portion 20 and the detector 30. The electronic components are located in the detector 30 alone attached to the second surface 13b of the transparent support plate 13 adjacent to the inside of the machine. The relay board 47 is thus unconnected to the operable portion 20.

5. Detecting Pressing Operation with Pushbutton Switch

Figure 12:
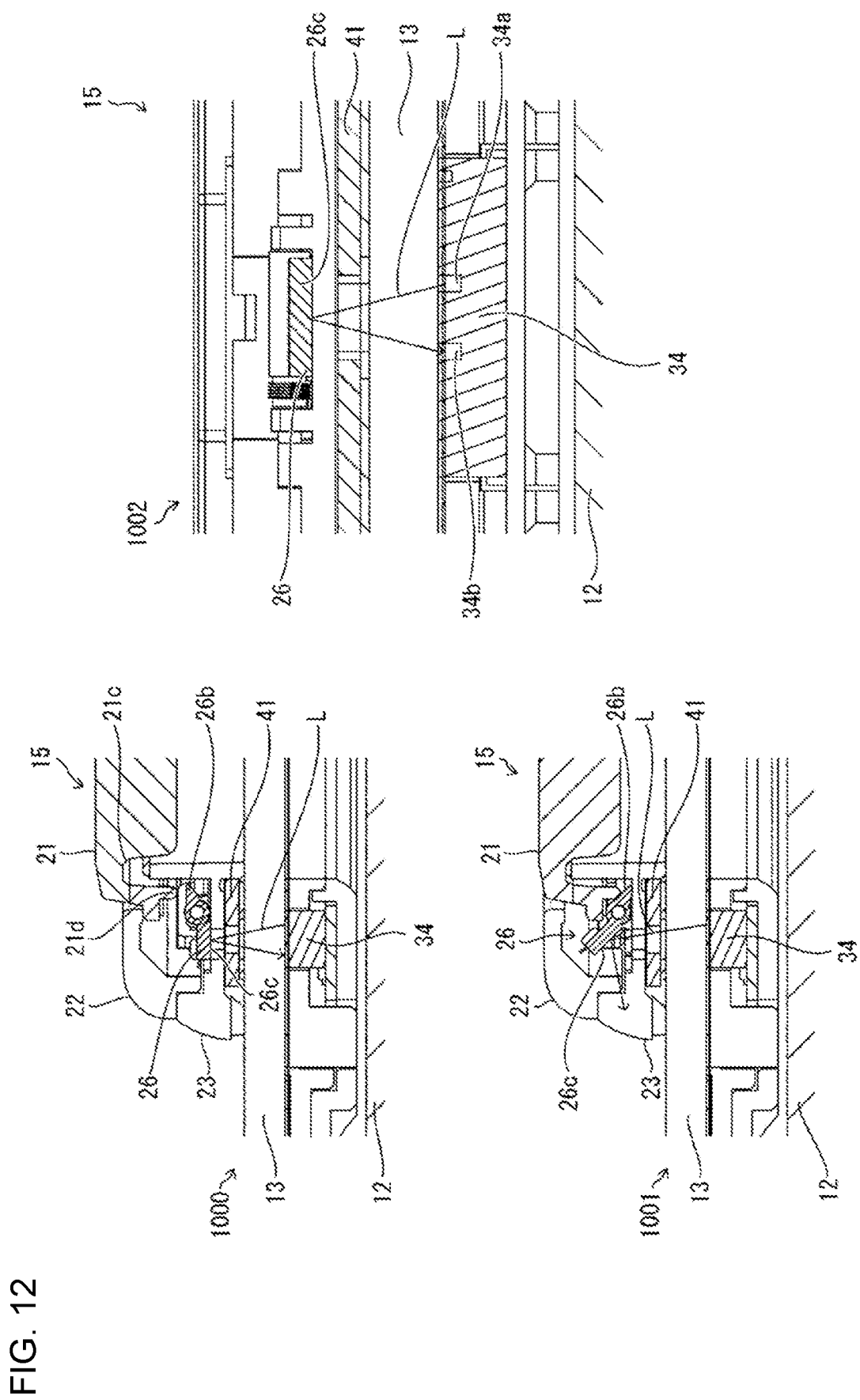
FIG. 12 is a diagram illustrating views of a structure for detecting a pressed state of a button in a pushbutton switch in a button deck, such as is shown in FIG. 2.

FIG. 12 includes views each showing a structure for detecting the pressed state of the button 21 in the pushbutton switch 15 in the button deck 10. FIG. 12 includes a cross-sectional view 1000 of the main part of the pushbutton switch 15 with the button 21 being unpressed, and includes a cross-sectional view 1001 of the main part of the pushbutton switch 15 with the button 21 being pressed. FIG. 12 also includes a cross-sectional view 1002 of the main part of the pushbutton switch 15 being unpressed. The view 1002 is taken along a line different from the line for the view 1001.

As shown in the views 1000 and 1002 in FIG. 12, when the button 21 is unpressed, each reflective flapper 26 in the operable portion 20 is in a first orientation to reflect light from the corresponding reflective sensor 34 in the detector 30 in the direction back toward the reflective sensor 34. In the first orientation, the reflective surface reflects light from the light emitter 34a in the direction for entry into the light receiver 34b.

The light receiver 34b receives, through the transparent support plate 13, light L emitted from the light emitter 34a and reflected by the reflective flapper 26 in the first orientation. The light receiver 34b outputs an electrical signal corresponding to the intensity of the received reflected light, and allows detection of the button 21 being unpressed based on the electrical signal.

As shown in the view 1001 in FIG. 12, when the button 21 is pressed, each reflective flapper 26 in the operable portion 20 is in a second orientation to reflect light from the corresponding reflective sensor 34 in the detector 30 in a direction different from the direction toward the reflective sensor 34. In the second orientation, the reflective surface reflects light from the light emitter 34a in a direction different from the direction for entry into the light receiver 34b.

The light receiver 34b does not receive light L emitted from the light emitter 34a and reflected by the reflective flapper 26 in the second orientation, and thus receives light with reduced intensity. The light receiver 34b outputs a lower electrical signal in accordance with the reduced intensity of received light. This change in the electrical signal allows detection of the button 21 being pressed.

6. Tabs 41a on First Attachment 41

Figure 13:
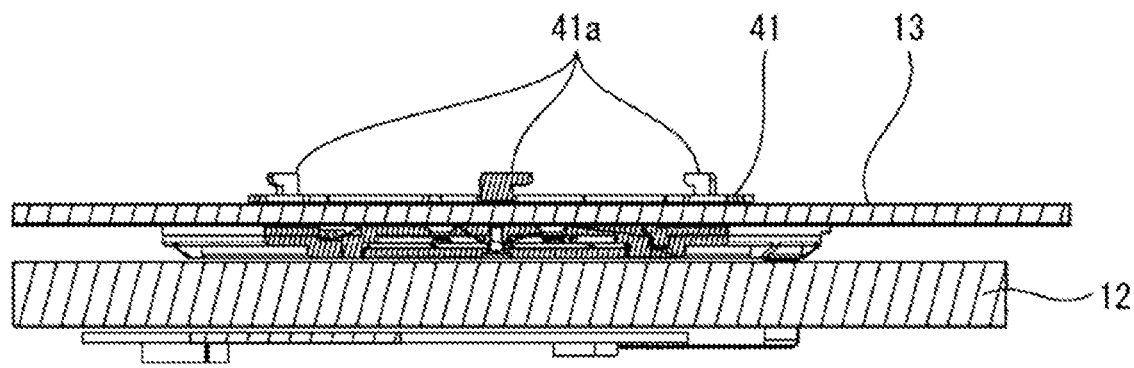
FIG. 13 is a diagram illustrating a cross-sectional view of tabs on a first attachment in a button deck, such as is shown in FIG. 4.
Figure 14:
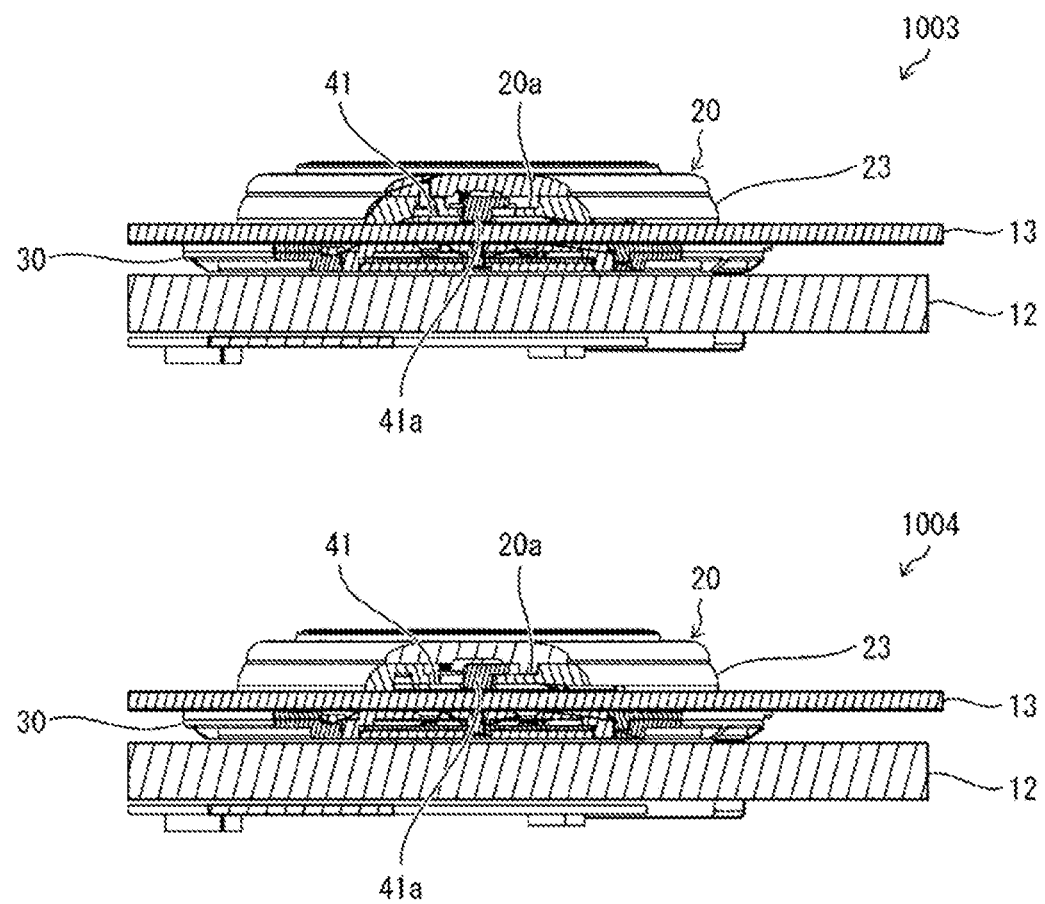
FIG. 14 is a diagram illustrating cross-sectional views each showing an engagement portion of a base for engagement with a corresponding tab, such as is shown in FIG. 13.

FIG. 13 is a cross-sectional view showing tabs 41a on the first attachment 41 in the button deck 10 shown in FIG. 4. FIG. 14 includes cross-sectional views each showing an engagement portion 20a of the base 23 for engagement with the corresponding tab 41a shown in FIG. 13.

As shown in FIG. 13, the first attachment 41 includes the multiple tabs 41a protruding upward. Each tab 41a is an L-shaped hook. As shown in FIG. 14, the base 23 includes the engagement portion 20a engageable with the tab 41a. The base 23 is rotatable about an axis aligned with the pressing direction from the operable portion 20 toward the detector 30. This engages the engagement portion 20a with the tab 41a, thus engaging the base 23 with the first attachment 41. The base 23 being engaged with the first attachment 41 can tightly fasten the operable portion 20 to the first attachment 41. The base 23 includes multiple engagement portions 20a corresponding to the multiple tabs 41a.

In the state shown in a view 1003 in FIG. 14, the tab 41a is spaced from the engagement portion 20a. When the base 23 is rotated to engage with the first attachment 41, the engagement portion 20a engages with the tab 41a as shown in a view 1004 in FIG. 14. The engagement portion 20a being engaged with the tab 41a can securely engage the operable portion 20 with the first attachment 41.

7. Lock Assembly for Operable Portion 20

FIG. 15 includes views each showing a lock assembly for the operable portion 20 shown in FIG. 7. As shown in FIG. 15, the first attachment 41 has the loose-fitting hole 41h for loosely receiving the locking magnet 27 with the base 23 being engaged with the first attachment 41. As shown in a view 1005 in FIG. 15, when the locking magnet 27 faces the repulsion magnet 35b with the transparent support plate 13 in between, the repulsion magnet 35b repels and lifts the locking magnet 27. In this state, the locking magnet 27 is outside the loose-fitting hole 41h and allows rotation of the base 23 in the direction for disengagement.

As shown in a view 1006 in FIG. 15, when the locking magnet 27 faces the attraction magnet 35a with the transparent support plate 13 in between, the attraction magnet 35a attracts the locking magnet 27. In this state, the locking magnet 27 is loosely fitted in the loose-fitting hole 41h and locks the base 23 to the first attachment 41. Operating the above operation lever 36 can switch between the state shown in the view 1005 and the state shown in the view 1006.

This can lock and unlock the operable portion 20 to and from the first attachment 41. The operation lever 36 may be constantly urged to the position for locking. This eliminates movement of the operation lever 36 after the base 23 engages with the first attachment 41. When the base 23 engages with the first attachment 41, the operation lever 36 at the position for locking can also magnetically attract the locking magnet 27 with the attraction magnet 35a and automatically lock the operable portion 20. In this case, the operation lever 36 is to be operated simply for removing the base 23 from the first attachment 41.

The operable portion 20 may include multiple locking magnets 27, and the first attachment 41 may have multiple loose-fitting holes 41h corresponding to the multiple locking magnets 27. In this case, the above switcher selectively places multiple attraction magnets 35a or multiple repulsion magnets 35b at the positions corresponding to the locking magnets 27. The multiple attraction magnets 35a and the multiple repulsion magnets 35b can lock the operable portion 20 to the first attachment 41 more securely.

8. Effects

As described above, in the above structure, the switcher can place the attraction magnet 35a to attract the locking magnet 27 at the position facing the locking magnet 27, thus locking the operable portion 20 to the first attachment 41. The operation lever 36 is operable from the back surface alone of the transparent support plate 13 that is accessible to no person other than the manager of the amusement machine 1. This prevents the operable portion 20 from being removed from the pushbutton switch 15 by a person other than the manager of the amusement machine 1.

The pushbutton switch 15 includes, as fully separate portions, the operable portion 20 and the detector 30 that are located on different surfaces, specifically the front and back surfaces, of the transparent support plate 13. The transparent support plate 13 thus eliminates an opening for receiving the pushbutton switch and avoids fracture due to a decrease in strength.

The above structure eliminates work for producing an opening in the transparent support plate 13 and facilitates attachment of the pushbutton switch 15. The above structure also reduces restrictions on the attachment position of the pushbutton switch 15, increasing flexibility in attachment.

A known pushbutton switch, which includes an operable portion 20 and a detector 30 integral with each other, is to have a different thickness for a transparent support plate 13 with a different thickness (or with a different depth of the attachment opening). In contrast, the pushbutton switch with the above structure is attachable to the transparent support plate 13 with a different thickness that allows the detector 30 to detect the pressed state of the button 21.

In the above structure, the electronic components for detecting the pressed state of the button 21 can be included without being located in the operable portion 20. More specifically, the multiple LEDs 38 for lighting the pushbutton switch 15 are located in the detector 30. The operable portion 20 uses no electricity and eliminates, for example, wiring, thus facilitating maintenance. The transparent support plate 13 also eliminates openings for wiring.

In the above structure, the button 21 includes a transparent portion. The detector 30 has an opening or is formed from a transparent material in its area corresponding to the button 21. This allows the screen of the display 12 to be viewed through the button 21.

The first attachment 41 and the second attachment 43 facilitate attachment of the operable portion 20 and the detector 30 to the transparent support plate 13.

Overview

A switch, a unit, and a machine according to one or more aspects of the present invention have the structures described below.

More specifically, a pushbutton switch according to an aspect of the present invention includes an attachment fixed to one surface of a support being a plate, an operable portion removably engaged with the attachment, and a detector attached to another surface of the support and facing the operable portion. The operable portion includes a press portion and a movable magnet movable in a pressing direction from the operable portion toward the detector and in a direction opposite to the pressing direction. The operable portion is rotatable about an axis aligned with the pressing direction to be engaged with the attachment. The attachment has a loose-fitting hole to loosely receive the movable magnet with the operable portion being engaged with the attachment. The detector includes a switcher that selectively places a first magnet to attract the movable magnet or a second magnet to repel the movable magnet at a position facing the movable magnet with the operable portion being engaged with the attachment.

In the above structure, the switcher can place the first magnet to attract the movable magnet at the position facing the movable magnet, thus locking the operable portion to the attachment. This prevents the operable portion from being removed from the pushbutton switch by a person other than the manager.

In the pushbutton switch according to the above aspect, the attachment may include a tab. The operable portion may include an engagement portion. The operable portion may be engaged with the attachment through engagement of the engagement portion with the tab.

The above structure can securely engage the operable portion with the attachment through engagement of the engagement portion with the tab.

In the pushbutton switch according to the above aspect, the operable portion may further include a base supporting the press portion. The base may include the engagement portion.

The above structure can tightly fasten the operable portion to the attachment using the engagement portion of the base supporting the press portion.

An operating unit according to one or more embodiments may include a transparent support and a display together serving as a touchscreen, and a pushbutton switch. The pushbutton switch includes an attachment fixed to a surface of the transparent support opposite to the display, an operable portion removably engaged with the attachment, and a detector attached to a surface of the transparent support adjacent to the display. The detector faces the operable portion. The operable portion includes a press portion and a movable magnet movable in a pressing direction from the operable portion toward the detector and in a direction opposite to the pressing direction. The operable portion is rotatable about an axis aligned with the pressing direction to be engaged with the attachment. The attachment has a loose-fitting hole to loosely receive the movable magnet with the operable portion being engaged with the attachment. The detector includes a switcher that selectively places a first magnet to attract the movable magnet or a second magnet to repel the movable magnet at a position facing the movable magnet with the operable portion being engaged with the attachment.

An amusement machine according to one or more embodiments may include a first display that displays an image for amusement, a transparent support and a second display together serving as a touchscreen, and a pushbutton switch. The pushbutton switch includes an attachment fixed to a surface of the transparent support opposite to the second display, an operable portion removably engaged with the attachment, and a detector attached to a surface of the transparent support adjacent to the second display. The detector faces the operable portion. The operable portion includes a press portion and a movable magnet movable in a pressing direction from the operable portion toward the detector and in a direction opposite to the pressing direction. The operable portion is rotatable about an axis aligned with the pressing direction to be engaged with the attachment. The attachment has a loose-fitting hole to loosely receive the movable magnet with the operable portion being engaged with the attachment. The detector includes a switcher that selectively places a first magnet to attract the movable magnet or a second magnet to repel the movable magnet at a position facing the movable magnet with the operable portion being engaged with the attachment.

The present invention is not limited to the above embodiments, but may be modified variously within the spirit and scope of the claimed invention. The technical means described in different embodiments may be combined as appropriate in other embodiments within the technical scope of the invention. The technical means described in different embodiments may be combined to produce a new technical feature.

The invention claimed is:

1. A pushbutton switch, comprising:
an attachment fixed to a first surface of a support comprising a plate;
an operable portion removably engaged with the attachment; and
a detector attached to a second surface of the support and facing the operable portion,
wherein the operable portion comprises a press portion and a movable magnet movable in a pressing direction from the operable portion toward the detector and in a direction opposite to the pressing direction, and the operable portion is rotatable about an axis parallel to the pressing direction so as to be engaged with the attachment,
the attachment has a loose-fitting hole to loosely receive the movable magnet while the operable portion is engaged with the attachment, and
the detector comprises a switcher configured to selectively place a first magnet to attract the movable magnet or a second magnet to repel the movable magnet at a position facing the movable magnet while the operable portion is engaged with the attachment.

2. The pushbutton switch according to claim 1, wherein the attachment comprises a tab,
the operable portion comprises an engagement portion, and
the operable portion is engaged with the attachment through engagement of the engagement portion with the tab.

3. The pushbutton switch according to claim 2, wherein the operable portion further comprises a base supporting the press portion, and the base comprises the engagement portion.

4. An operating unit, comprising:
a transparent support and a display together serving as a touchscreen; and
a pushbutton switch,
wherein the pushbutton switch comprises
an attachment fixed to a surface of the transparent support opposite to the display,
an operable portion removably engaged with the attachment, and
a detector attached to a surface of the transparent support adjacent to the display, the detector facing the operable portion,
the operable portion comprises a press portion and a movable magnet movable in a pressing direction from the operable portion toward the detector and in a direction opposite to the pressing direction, and the operable portion is rotatable about an axis parallel to the pressing direction so as to be engaged with the attachment,
the attachment has a hole to receive the movable magnet while the operable portion is engaged with the attachment, and
the detector comprises a switcher configured to selectively place a first magnet to attract the movable magnet or a second magnet to repel the movable magnet at a position facing the movable magnet while the operable portion is engaged with the attachment.

5. An amusement machine, comprising:
a first display configured to display an image;
a transparent support and a second display together serving as a touchscreen; and
a pushbutton switch,
wherein the pushbutton switch comprises
an attachment fixed to a surface of the transparent support opposite to the second display,
an operable portion removably engaged with the attachment, and
a detector attached to a surface of the transparent support adjacent to the second display, the detector facing the operable portion,
the operable portion comprises a press portion and a movable magnet movable in a pressing direction from the operable portion toward the detector and in a direction opposite to the pressing direction, and the operable portion is rotatable about an axis parallel to the pressing direction so as to be engaged with the attachment,
the attachment has a hole to receive the movable magnet while the operable portion is engaged with the attachment, and
the detector comprises a switcher configured to selectively place a first magnet to attract the movable magnet or a second magnet to repel the movable magnet at a position facing the movable magnet while the operable portion is engaged with the attachment.

* * * * *